United States Patent
Karakulak et al.

(10) Patent No.: US 8,493,791 B2
(45) Date of Patent: Jul. 23, 2013

(54) WORD-LINE INTER-CELL INTERFERENCE DETECTOR IN FLASH SYSTEM

(71) Applicant: STEC, Inc., Santa Ana, CA (US)

(72) Inventors: Seyhan Karakulak, San Diego, CA (US); Anthony D. Weathers, San Diego, CA (US); Richard D. Barndt, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/725,689

(22) Filed: Dec. 21, 2012

(65) Prior Publication Data

US 2013/0163327 A1 Jun. 27, 2013

Related U.S. Application Data

(60) Provisional application No. 61/580,140, filed on Dec. 23, 2011.

(51) Int. Cl.
*G11C 16/04* (2006.01)

(52) U.S. Cl.
USPC ............ 365/185.18; 365/185.02; 365/185.24; 365/185.33

(58) Field of Classification Search
USPC .................................................... 365/185.18
See application file for complete search history.

(56) References Cited

U.S. PATENT DOCUMENTS 7,898,863 B2 * 3/2011 Aritome .................... 365/185.18
8,085,605 B2 * 12/2011 Yang et al. ................ 365/189.15

* cited by examiner

*Primary Examiner* — Son Mai
(74) *Attorney, Agent, or Firm* — McDermott Will & Emery LLP

(57) ABSTRACT

Aspects of the subject technology encompass a method for retrieving information stored in flash memory. In certain implementations, the method can include operations for reading a plurality of memory cells in a word line, generating a plurality of read signals based on the reading of the plurality of memory cells and identifying, from among the plurality of read signals, a first read signal associated with a first memory cell and a second read signal associated with a second memory cell, wherein the first memory cell is adjacent to the second memory cell in the word line. In certain aspects, the method can further include operations for generating an output for the first memory cell, wherein the output is based on the first and second read signals. A data storage system and article of manufacture are also provided.

23 Claims, 13 Drawing Sheets

| L1 Distribution | % Change in the Mean | % Change in the Variance |
|---|---|---|
| Left cell is programmed at L3 | 8.13% | 33.04% |
| Right cell is programmed at L3 | 9.67% | 28.04% |
| Both left and right cells are programmed at L3 | 18.78% | 0.37% |

FIG. 6

WORD-LINE INTER-CELL INTERFERENCE DETECTOR IN FLASH SYSTEM

This application claims the benefit of U.S. Provisional Application No. 61/580,140 filed Dec. 23, 2011, entitled "WORD-LINE INTER-CELL INTERFERENCE DETECTOR IN FLASH SYSTEM," which is incorporated herein by reference.

BACKGROUND

The present disclosure relates to the retrieval of information from flash memory devices, such as solid-state drives (SSDs). Particularly, the present disclosure pertains to a system and method for mitigating the effect of inter-cell interference (ICI) on a flash memory output within a flash memory device.

SUMMARY

In certain aspects, the subject technology relates to a method for retrieving information stored in flash memory, obtaining a plurality of read signals from a plurality of memory cells on a word line, and identifying, from among the plurality of read signals, a first read signal associated with a first memory cell and a second read signal associated with a second memory cell, wherein the first memory cell is adjacent to the second memory cell in the word line. In some implementation, the method further includes steps for generating an output for the first memory cell, wherein the output is based on the first read signal and the second read signal.

In another aspect, the subject technology can relate to a data storage system, including a configuration memory, a plurality of memory cells, and a controller coupled to the configuration memory and the plurality of memory cells, wherein the controller is configured to perform operations for obtaining a plurality of read signals from a plurality of memory cells on a word line and identifying, from among the plurality of read signals, a first read signal associated with a first memory cell and a second read signal associated with a second memory cell, wherein the first memory cell is adjacent to the second memory cell in the word line. In certain implementations, the controller can be further configured to perform operations for generating an output for the first memory cell, wherein the output is based on the first read signal and the second read signal.

In yet another aspect, the subject technology relates to an article of manufacture for mitigating effects of inter-cell interference in an electronic storage. The article of manufacture may include at least one non-transitory processor readable storage medium and instructions stored on the medium, wherein the instructions are configured to be readable by at least one processor and thereby cause the processor to perform operations for obtaining a plurality of read signals from a plurality of memory cells on a word line and identifying, from among the plurality of read signals, a first read signal associated with a first memory cell and a second read signal associated with a second memory cell, wherein the first memory cell is adjacent to the second memory cell in the word line. In some aspects, the instructions may further cause the processor to perform operations for generating an output for the first memory cell, wherein the output is based on the first read signal and the second read signal.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

BRIEF DESCRIPTION OF THE DRAWINGS

FIG. 6 illustrates percentage changes in the means and variances of certain probability density functions based on the data levels of adjacent cells, according to certain aspects of the present disclosure.

DETAILED DESCRIPTION

Figure 1:
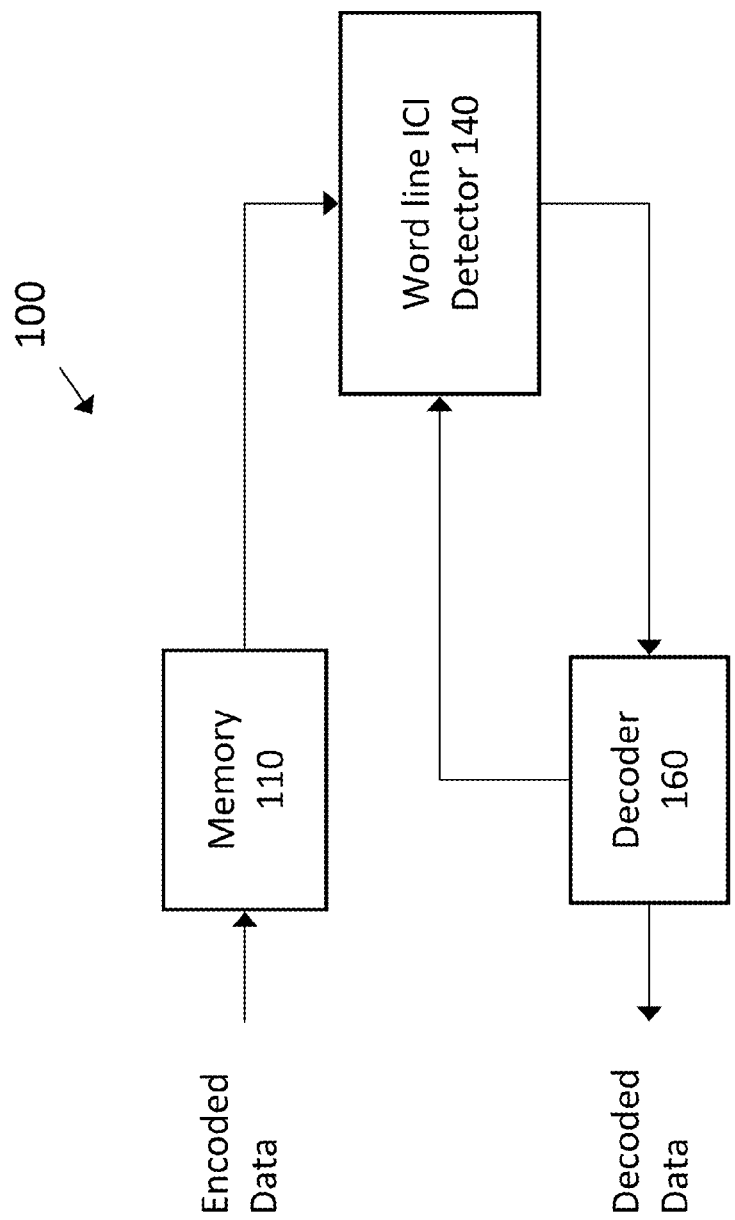
FIG. 1 is a flow diagram illustrating an example of a flash system using a word line ICI detector, according to some aspects of the present disclosure.

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent to those skilled in the art that the present disclosure may be practiced without these specific details. In some instances, well-known structures and components are shown in block diagram form in order to avoid obscuring the concepts of the present disclosure. Like components are labeled with identical element numbers for ease of understanding.

In flash memory devices, the threshold voltage level of a cell may be increased when the neighboring cells are programmed. An increase in the threshold voltage level of a cell due to programming its neighbors is called inter-cell interference (ICI). The impact of ICI is pattern dependent and depends on the flash device operating conditions, such as endurance cycles, retention, and the ambient temperature for programming and reading the flash device. Further, ICI depends on the number of bits programmed per cell and the density of the cells. With the continuing demands for smaller flash devices, ICI is expected to increase substantially. Such increase in ICI could substantially degrade a flash system's performance if its effect is not mitigated in detection and decoding steps.

The present disclosure provides a flash system with a detector that takes into account the inter-cell interference (ICI) arising from adjacent cells, particularly in the word line direction. In various aspects, the word line direction is the natural direction of reading a flash memory device. The output that the detector generates has less noise and as a result, the output can be decoded with a lower probability of failure. In some implementations, the word line ICI detector can accept hard or soft inputs and generate soft or hard outputs. Algorithms such as maximum a posteriori (MAP) algorithm, soft output Viterbi algorithm (SOVA), or Max-log-MAP and the Viterbi algorithm can be utilized in the detector to generate soft or hard outputs based on inter-cell interference data. The outputs of the detector are then fed to a decoder. Since the effect of ICI is mitigated by the word line ICI detector, the performance of the decoder can be enhanced. In the presence of constrained codes, the word line ICI detector can consider the constraints in the detection process.

The word line ICI detector can utilize a model based on training data and a MAP algorithm. Detection performances utilizing a word line ICI detector are significantly better than detection performances of a traditional threshold detector that does not consider the effect of word line ICI. In addition, detection performances utilizing a word line ICI detector are further increased where there are offsets in the probability density functions used in flash reading.

FIG. 1 is a block diagram illustrating an example of a system 100 for decoding information stored on a flash memory device using a word line ICI detector 140, according to some aspects of the present disclosure. Specifically, FIG. 1 illustrates a flash system that considers the word line ICI in the detection step. In this system, the encoded data is written to flash memory 110 in a known manner. The encoded data is read from the flash memory 110 by means of one read or multiple reads. The flash memory output can contain hard decisions on levels obtained from one read or soft information obtained from multiple reads. Outputs with soft information typically have more reliable information. However, the process required for generating soft information can introduce delays and require extra storage due to the number of additional reads. The flash output is then fed to the word line ICI detector 140. The word line ICI detector 140 generates soft information as described further below, which is further processed by decoder 160. In some implementations, the decoder 160 generates new soft information and feeds the information back to the word line ICI detector 140. In some implementations, the decoder 160 feeds the information to the word line ICI detector 140 in an iterative manner. The iteration process may continue until the decoder 160 decodes successfully or the maximum number of iterations is reached. In certain aspects, in the presence of constrained codes, the word line ICI detector 140 can consider the constraints in the detection process. In some implementations, the word line ICI detector 140 and the decoder 160 can also process hard decisions inputs.

The word line ICI detector 140 may include a trellis-based detection algorithm to generate soft information for the decoder 160. Alternatively, word line ICI detector 140 may include a sequence detector such as a decision feedback equalizer (DFE) and a fixed-depth delay tree-search with DFE. Soft information generated by the word line ICI detector 140 may be in the form of log-likelihood ratios (LLRs), a posteriori probabilities (APPs), or approximation of LLRs or APPs. Several different algorithms can be utilized by the word line ICI detector 140 depending on the input and output types. For example, if APPs are required as an output, a BCJR algorithm that utilizes forward and backward state metrics with state transition metrics can be used. For the BCJR algorithm, the whole sequence on a word line or a partial word line needs to be retrieved due to its forward and backward recursive computations. Depending on the word line size, the BCJR algorithm may introduce a long delay for detection. Complex arithmetic operations such as the BCJR algorithm require complex hardware implementations. Therefore, to eliminate delay and the necessity of complex hardware implementations, algorithms that approximate the APPs can be used. For example, sliding window implementations of the BCJR algorithm can be used. In the sliding window implementation, the approximate APP of each level at a given time or location is obtained by considering a finite length of forward and backward signals, which reduces a possible delay. To further reduce hardware complexity, algorithms such as the Max-Log-MAP algorithm (which can approximate and/or simplify probability calculations), can also be implemented.

Other low-complexity methods that approximate the APPs utilize Viterbi type detection algorithms. For example, the soft-output Viterbi algorithm (SOVA) and the modified SOVA algorithm have considerably less detection complexity as compared to the BCJR algorithm. In some implementations, LLRs can be obtained from APPs or from approximate APPs and a hard decision can be made on the APPs with a decision rule that minimizes the symbol error rate (SER). For hard decisions, a symbol sequence detection algorithm, such as the Viterbi algorithm, which outputs the maximum-likelihood (ML) sequence, can be utilized.

Figure 2:
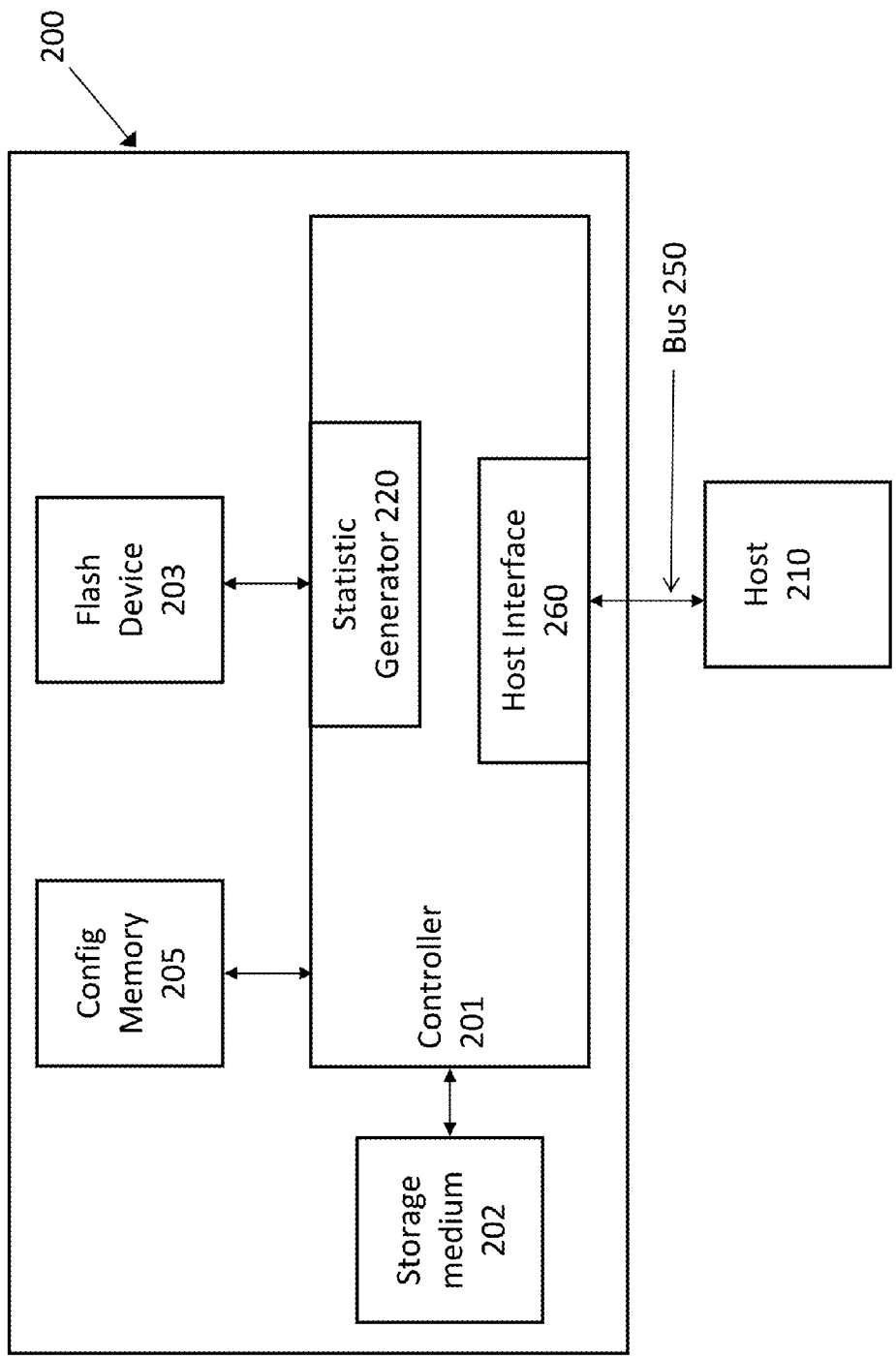
FIG. 2 is a block diagram illustrating components of a flash memory device according to one aspect of the present disclosure.

FIG. 2 is a block diagram illustrating example components of a data storage system 200 (for example, a solid state drive), according to one aspect of the present disclosure. Data storage system 200 may include a data storage controller 201, storage medium 202, configuration memory 205, and flash device 203. Controller 201 may use storage medium 202 for temporary storage of data and information used to manage data storage system 200. Controller 201 may include several internal components (not shown) such as one or more processors, a read-only memory, a flash component interface (for example, a multiplexer to manage instruction and data transport along a serial connection to flash device 203), an I/O interface, error correction circuitry, and the like. In some aspects, one or more elements of controller 201 may be integrated into a single chip. In other aspects, the elements may be implemented on two or more discrete components.

Controller 201 may also include a processor configured to execute code or instructions to perform the operations and functionality described herein. For example, controller 201 can be configured to perform operations for managing request flow and address mappings, and to perform calculations and generate commands. The processor of controller 201 can be to monitor and control the operation of the components in data storage controller 201. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 201 and/or its processor. One or more sequences of instructions may be software stored and read from storage medium 202, flash device 203, or received from host device 210 (for example, via a host interface). ROM, storage medium 202, flash device 203, represent examples of machine or computer readable media on which instructions/code executable by controller 201 and/or its processor may be stored. Machine or computer readable media may generally refer to any medium or media used to provide instructions to controller 201 and/or its processor, including both volatile media, such as dynamic memory used for storage media 202 or for buffers within controller 201, and non-volatile media, such as electronic media, optical media, and magnetic media.

In some aspects, controller 201 is configured to store data received from host device 210 in flash device 203 in response to a write command from host device 210. Controller 201 is further configured to read data stored in flash memory 203 and to transfer the read data to host device 210 in response to a read command from host device 210. As will be described in more detail below, controller 201 is configured to generate inter-cell interference statistics based on training data and to generate an ICI detector output for the decoder based on the read signals and the inter-cell interference statistics. In some implementations, inter-cell interference statistics are pre-generated and made available to the data storage system 200 by various methods, via an external memory, for example. By taking into account the inter-cell interference statistics, and in particular the inter-cell interference in the word line direction, the present disclosure improves SSD performance and reduces error rates compared to performance of SSD using flash memory cells in the same application environment without word line ICI detection.

Host device 210 represents any device configured to be coupled to data storage system 200 and to store data in data storage system 200. Host device 204 may be a computing system such as a personal computer, a server, a workstation, a laptop computer, PDA, smart phone, and the like. Alternatively, host device 204 may be an electronic device such as a digital camera, a digital audio player, a digital video recorder, and the like.

In some aspects, storage medium 202 represents volatile memory used to temporarily store data and information used to manage data storage system 200. According to one aspect of the present disclosure, storage medium 202 is random access memory (RAM) such as double data rate (DDR) RAM. Other types of RAM also may be used to implement storage medium 202. Storage medium 202 may be implemented using a single RAM module or multiple RAM modules. While storage medium 202 is depicted as being distinct from controller 201, those skilled in the art will recognize that storage medium 202 may be incorporated into controller 201 without departing from the scope of the present disclosure. Alternatively, storage medium 202 may be a non-volatile memory such as a magnetic disk, flash memory, peripheral SSD, and the like.

As further depicted in FIG. 2, data storage system 200 may also include bus 250. The bus 250 may use suitable interfaces standard including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

Host device 210 and data storage system 200 can be in communication with each other via a wired or wireless connection and may be local to or remote from one another. According to some aspects, data storage system 200 can include pins (or a socket) to mate with a corresponding socket (or pins) on host device 210 to establish an electrical and physical connection. According to one or more other aspects, data storage system 200 includes a wireless transceiver to place host device 210 and data storage system 200 in wireless communication with each other.

Data storage system 200 may further include a host interface 260. Host interface 260 is configured to be coupled to host device 210, to receive data from and send data to host device 210. Host interface 260 may include both electrical and physical connections for operably coupling host device 210 to controller 201. Host interface 260 is configured to communicate data, addresses, and control signals between host device 210 and controller 201.

Flash device 203 represents a non-volatile memory device for storing data. According to one aspect of the present disclosure, flash device 203 includes, for example, a NAND flash memory. Flash device 203 may include a single flash memory device or chip, and may include multiple flash memory devices or chips arranged in multiple channels. Flash device 203 is not limited to any particular capacity or configuration. For example, the number of physical blocks, the number of physical pages per physical block, the number of sectors per physical page, and the size of the sectors may vary within the scope of the present disclosure.

Flash memory may have a standard interface specification. This standard ensures that chips from multiple manufacturers can be used interchangeably (at least to a large degree). The interface may further hide the inner working of the flash memory and return only internally detected bit values for data.

Figure 3:
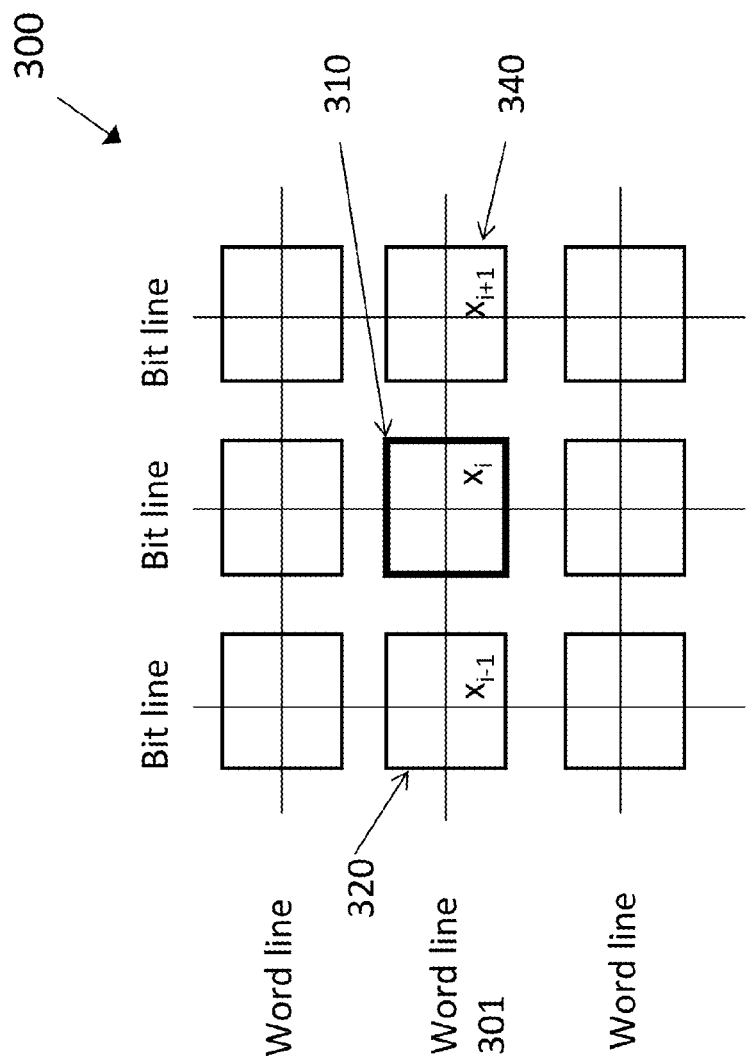
FIG. 3 illustrates a portion of a memory array of a flash memory device, according to some aspects of the present disclosure.

FIG. 3 illustrates a portion of a memory array 300 comprising memory cells of a flash storage device, according to some aspects of the present disclosure. Data stored in target memory cell 310 may be affected by the data stored in the adjacent cells. Adjacent cells may generate different inference signals depending on the type of data stored and the interference signals may cause voltage shifts in the target cell 310. The interference is called ICI and can be more damaging as the number of bits stored per cell increases or the cell density increases.

Particularly, ICI is largely affected by data stored in memory cells in the word lines below and above of target cell 310. ICI is also affected by the data stored in cells that are on the immediate left and right and target cell 310. For example, when target cell 310 is programmed, the data stored in target cell 310 may include an interference signal from the left adjacent cell 320 that stores data $x_{i-1}$. Similarly target cell 310 may also have another interference signal from the right adjacent cell 340 that stores data $x_{i+1}$. These interference signals are introduced when the cells are programmed and they can cause voltage shifts to the data stored ($x_i$) in the target cell 310. ICI can further be affected by the data stored in the target cell and the type of data (e.g., data levels) stored in other neighboring cells.

Traditional flash drive devices do not take ICI into consideration. Because no ICI mitigation is employed in these devices, the decoding performance is degraded. In certain aspects of the subject technology, ICI is taken into considerations. Particularly, ICI along the word line direction is considered. One of the advantages of considering only word line ICI is that only one word line or a portion of the word line (e.g., word line 301) has to be read. Therefore the system does not require extra processing power or memory requirement to store and process data from memory cells that are above or below word line 301. The effects of ICI from adjacent cells, particularly from the left adjacent cells, are better understood with reference to FIG. 5, described below.

Figure 4A:
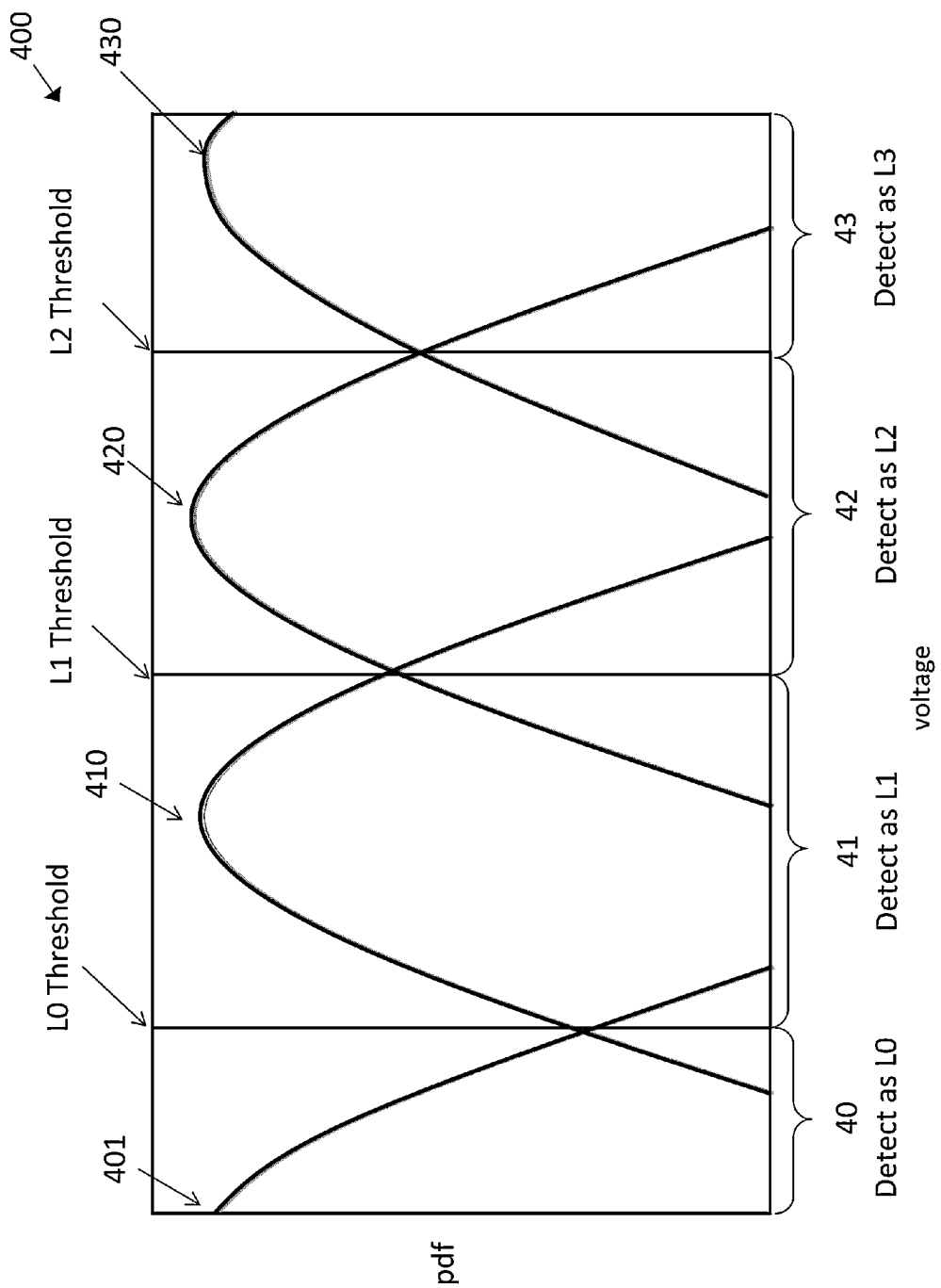
FIGS. 4A and 4B illustrate probability density functions for different data levels, according to some aspects of the present disclosure.

FIG. 4A graphically illustrates probability density functions 400 for L0, L1, L2, and L3 data levels, according to some aspects of the present disclosure. In the example illustrated in FIG. 4A, each memory cell employs four possible data levels to store two bits of data in each memory cell. FIG. 4A illustrates four distributions 401, 410, 420, and 430 that are obtained from training data. The distributions 401, 410, 420, and 430 correspond to the probability density functions for L0, L1, L2, and L3 data levels, respectively. The probability density functions 400 can be used by a threshold detector, for example to determine if a read signal should be read as L0, L1, L2, or L3 when a read signals falls in region 40, 41, 42, or 43, respectively.

Figure 4B:
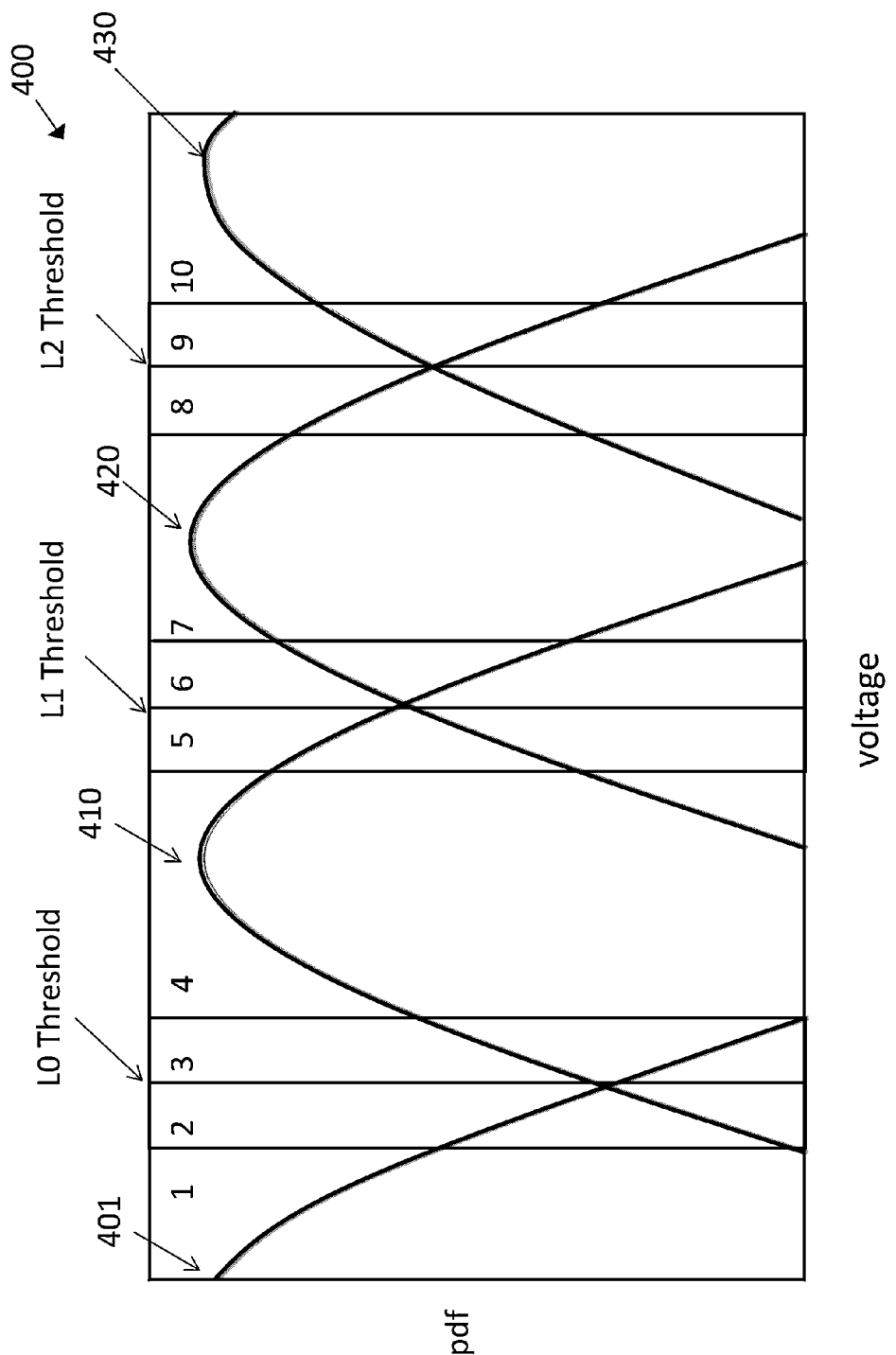

FIG. 4B illustrates the same probability density functions 400 for L0, L1, L2, and L3 data levels with multiple reads at and around each voltage threshold level. In the example illustrated in FIG. 4B, the voltage window is partitioned into ten bins 1-10. The number of bins is determined by the number of read levels. There are nine different reads and the voltage window is therefore divided into 10 regions or bins. At each optimal threshold voltage level, for instance at the threshold level of the boundary region of L0/L1 (e.g., the L0 Threshold), there are two other reads that are slightly lower and higher than the optimal threshold level of L0/L1 boundary region. Each optimal threshold level (L0 Threshold, L1 Threshold, and L3 Threshold) is the cross-over location at each boundary region. These optimal threshold levels may be obtained by training data or determined by flash manufacturers.

Figure 5:
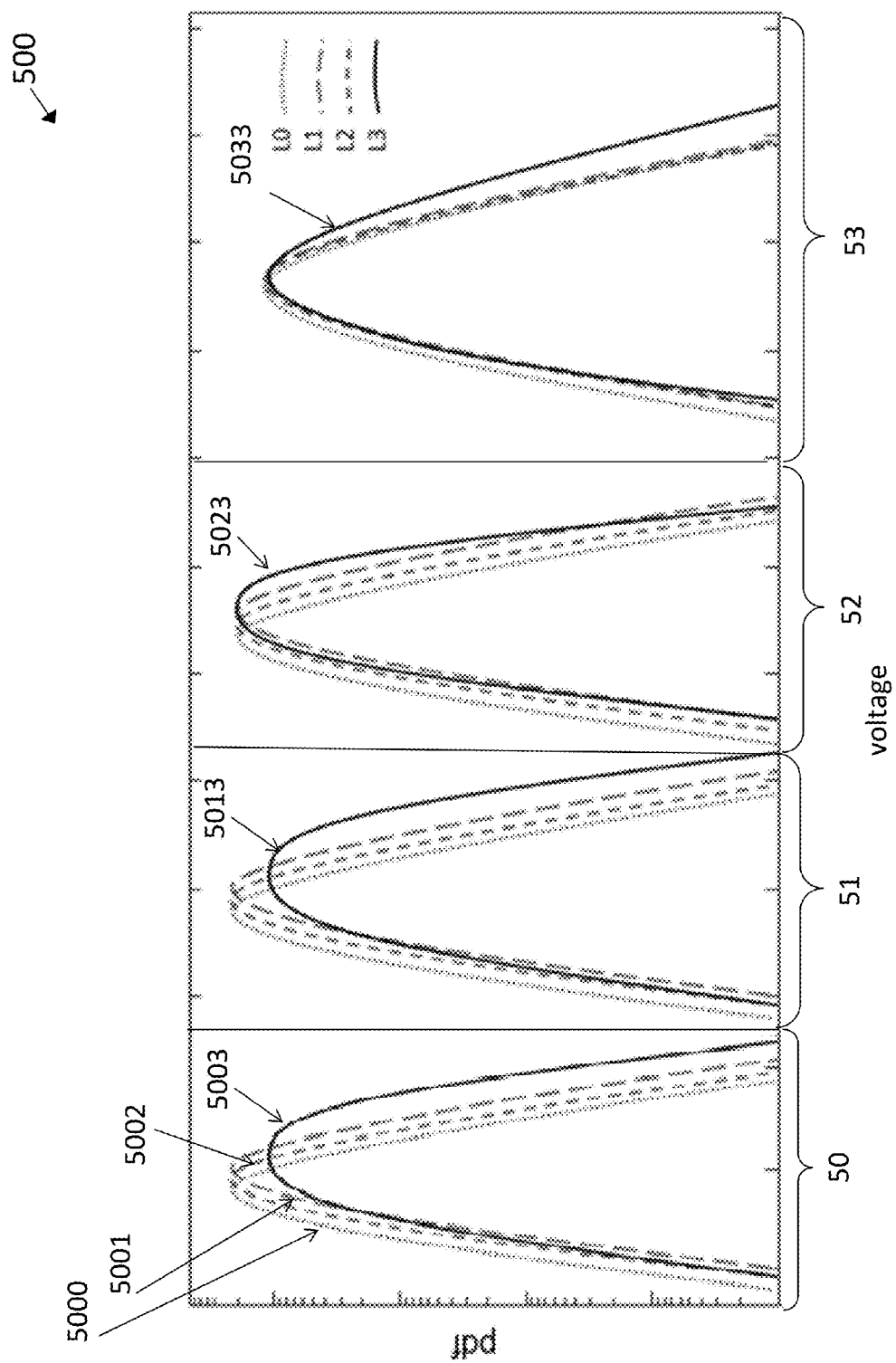
FIG. 5 illustrates group-based probability density functions for different data levels, according to some aspects of the present disclosure.

FIG. 5 graphically illustrates probability density functions 500 for a given group of target cells when their adjacent cells are programmed at certain data levels, according to some aspects of the present disclosure. Specifically, FIG. 5 shows different probability density functions of certain cells when their left cells are programmed at L0, L1, L2, and L3, respectively. It can also be observed that the probability density functions 5003, 5013, 5023, and 5033 for a group of reference cells are shifted to the right when their adjacent left cells are programmed at L3. Significant shifts in the voltage distributions are also observed when the right cells or when both left and right cells are programmed at L3.

In certain aspects, only the ICI of an adjacent cell (e.g., left adjacent cell 320) is considered for the target cell 310. As a result, there are only 16 probability density functions shown on FIG. 5. If two adjacent cells are considered, there are 64 probability density functions. In short, the number of probability density functions applicable to each possible data level of a given target cell is the number of possible data levels for each level raised to the number of adjacent cells that affect a given target cell.

In some implementations, each target cell 310 can have one of four possible data levels, there is one adjacent cell (left cell) per target cell 310 and each adjacent cell can have one of four possible levels. Thus, for illustration, there are sixteen (16=4*4[1]) total probability density functions. Four of which are for data level 0 (curves 5000-5003) attributable to four data levels (L0-L3) of the left cell. There are also four probability density functions for each of the other data levels L1, L2 and L3. The number of group-based probability density functions can be extended to multi-level flash devices having a different number of data levels per cell, eight for example, as well as other numbers of adjacent cells that can also cause inter-cell interference.

In certain implementations, the group-based probability density functions of FIG. 5 illustrate the ICI effects of the data stored on the left cell on a given target cell. While the effect of ICI on the probability density functions is illustrated, the probability density functions can express other distortions instead of ICI, or in addition to ICI. Distortions such as program disturb, read disturb, the age of the flash memory device, and/or additional noise can also be taken into consideration. Accordingly, the probability density functions can be updated based on additional distortions and represented as a stored table and/or an expression.

In one embodiment, the probability density functions are dynamically updated based on the operating conditions. For example, the group-based probability density functions as illustrated in FIG. 5 can further be based on the endurance or life of a flash device. At beginning of life of a flash device, a first group-based probability density functions may be used to define a trellis. At the middle of life, a second group-based probability density functions may be used. Similarly, at the end of life, a third group-based probability density functions may be used. The selected probably density functions may be chosen based on a predetermined number of program/erase cycles, for example.

Experimental results show that each memory cell experiences a major ICI in the word line direction from its immediate neighboring cells, namely the left and right cells. FIG. 6 demonstrates the changes in the mean and variance of a target cell when an adjacent cell is programmed at a certain level. Specifically, FIG. 6 shows shifts in the mean and variance values of L1 distribution of a group of target cells when the left cell of each of the target cells is programmed at L3, the right cell of each of the target cells is programmed at L3, and when both the left and the right cells of each of the target cells are programmed at L3. In some implementations, the mean values can shift from approximately 0.24% to approximately 20%, and more specifically from 8.13% to 18.78% in one embodiment. The degree of the mean shift can depend on various factors including types of flash devices, endurance and retention characteristics, and other related flash parameters. In certain implementations, the variance can also increase by approximately 33% due to the effects of interference from the data levels of adjacent cells. These changes can be mitigated when a word line ICI detector (e.g., word line ICI detector 140) is employed. That is, the changes in the mean values and variances are taken into account to produce a more accurate flash output for decoding. In some implementations, using the word line ICI detector of the present disclosure, improvements can be seen as much as 20% in symbol error rates (SER).

As indicated above, each memory cell experiences an ICI effect in a word line direction from the left and right cells. Therefore, to improve the detection performance, a flash channel model which considers the ICI from left and right cells may be implemented. Thus, the output of cell i can be represented as:

$$y(i)=f(x(i),x(i-1),x(i+1),n(i)) \quad (1)$$

where the channel output y(i) is a function of the current data level x(i), the data level x(i−1) of the left cell, the data level x(i+1) of the right cell, and the read noise n(i). In order to rectify the non-causality of equation 1, a delay can be introduced. By introducing a delay into the channel output, the channel response becomes causal. In some aspects, the causal relationship between the output of cell i is given by:

$$y(i)=f(x(i),x(i-1),x(i-2),n(i)) \qquad (2)$$

In some aspects, a detection trellis with a memory length of two cells is used to detect the output level of cell i, as represented in equation 1 and/or equation 2.

Figure 7:
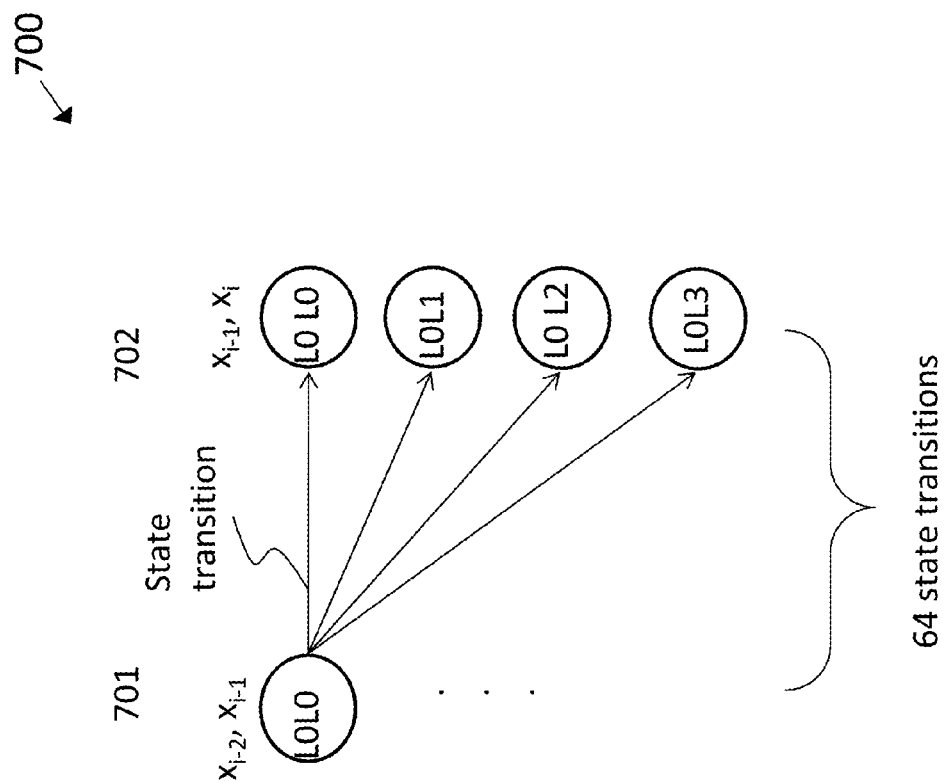
FIG. 7 illustrates a partial schematic of a trellis used by the word line ICI detector module for a flash channel with a memory length of two, according to certain aspects of the present disclosure.

FIG. 7 is a schematic of a partial trellis 700 used by a word line ICI detector (e.g., ICI detector 140). Particularly, FIG. 7 illustrates various state transitions from one state to another. The number of states depends on the memory length of the flash channel. Each of the states is defined by the cell values in the memory of the flash channel. For example, the state at time index 702 is defined by the cell values x(i) and x(i−1). Similarly, the state at time index 701 is defined by the cell values x(i−1) and x(i−2).

In partial trellis 700, state transitions occur between certain states depending on the data levels in the flash channel memory. For example, a state transition occurs when the state at time index 701 (with data levels L0L0) changes to another state at time index 702 e.g., with data levels L0L1 or L0L2.

As illustrated, there are four possible state transitions from L0L0 at time index 701 to another state at time index 702. The state at time index 702 could have any of the four following data levels: L0L0, L0L1, L0L2, and L0L3. While only the initial state L0L0 at time index 701 is shown, there are sixteen different initial states at time index 701 (L0L0, L0L1, L0L2, L0L3, L1L0, L1L1 ... L3L3) because the flash channel has a memory length of two cells and each cell could have any of the four data levels. Thus, the total number of state transitions from one state to another is 64 since there are four transitions from one state to another. Each state transition has the information to generate the likelihoods for each read signal. Detection algorithms such as the BCJR or SOVA are then run on the trellis to detect a data sequence.

In some implementations, the output or the performance of the word line ICI detector is better than the output of a conventional threshold detector, which utilizes thresholds to detect each level without considering ICI.

Referring back to FIG. 4A, in threshold detection, each of the distribution curves 401, 410, 420, and 430 represent the probability density curves for data levels L0, L1, L2, and L3, respectively. Thus, when a cell has a read signal that falls within region 41, it is interpreted by a threshold detector that the cell has the data level of L1. Likewise, when a cell has a read signal that falls within region 42, it is interpreted by the threshold detector that the cell has the data level of L2. Similarly, when a cell read signal falls within region 43, it is interpreted as L3 data level. Finally, if a cell read signal is in region 40, it is interpreted as L0 data level. The L0 detected cell is in an erased state and may store the encoded bit "11," whereas the L1, L2, and L3 detected cells may store the encoded bits "10", "00", and "01", respectively.

More accurate read outputs can be attained by obtaining soft information. In certain aspects, soft information is obtained by reading the memory cells multiple times, e.g., 3 reads around each boundary region, as shown in FIG. 4B. The probability of being at a certain bin for each level is computed from training data. The bin information of flash outputs or the conditional probabilities corresponding to the flash output are fed into the word line ICI detector. The BCJR algorithm (which computes the APP of each data level) is then utilized and optimal symbol detection is carried out by outputting the symbol level having the largest APP.

Figure 8:
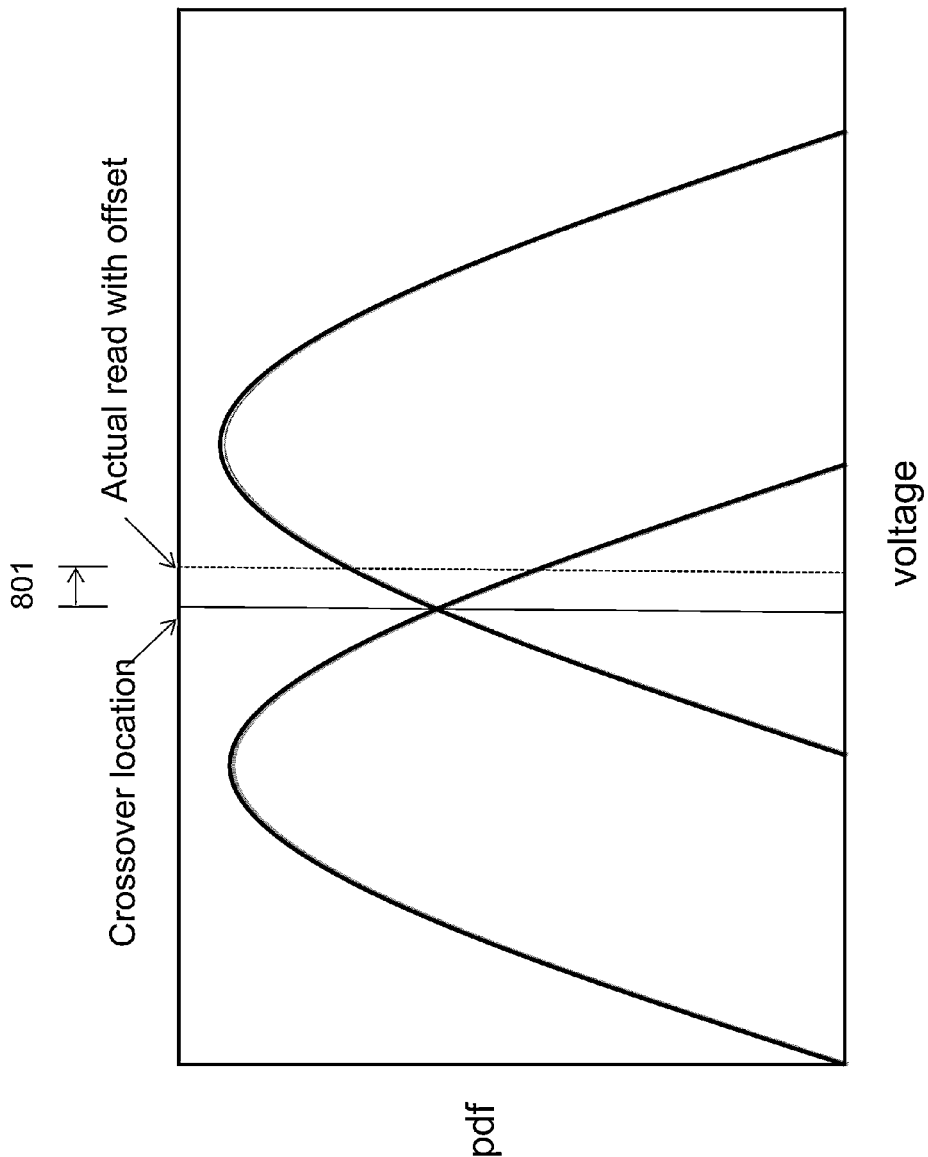
FIG. 8 illustrates probability density functions with a read with certain offsets, according to certain aspects of the present disclosure.

In certain aspects, the word line ICI detector of the present disclosure offers better results than traditional threshold volt-age sensing techniques. In traditional threshold detection techniques, sensing operations depend on the threshold detection levels for each level as shown in FIG. 4A. The threshold detection operation therefore depends heavily on the thresholds, which are the cross over locations of between two adjacent probability density function distributions. The thresholds are obtained using training data. In some instances, the thresholds can shift by a certain value due to variations from one flash device to another, from one die to another, from one block to another block, different firmware settings, and even as a flash device ages, etc. When these shifts are not estimated or obtained correctly, an offset in the read can occur. As illustrated in FIG. 8, an offset 801 (from the solid line to the new dash line) is observed when the crossover location of the distributions L1 and L2 is different than the actual read. The offsets can be in both directions. The offsets affect the symbol error rates (SER). Thus, in certain aspects, the word line ICI detector can significantly improve the SER in the presence of any offsets.

Figure 9B:
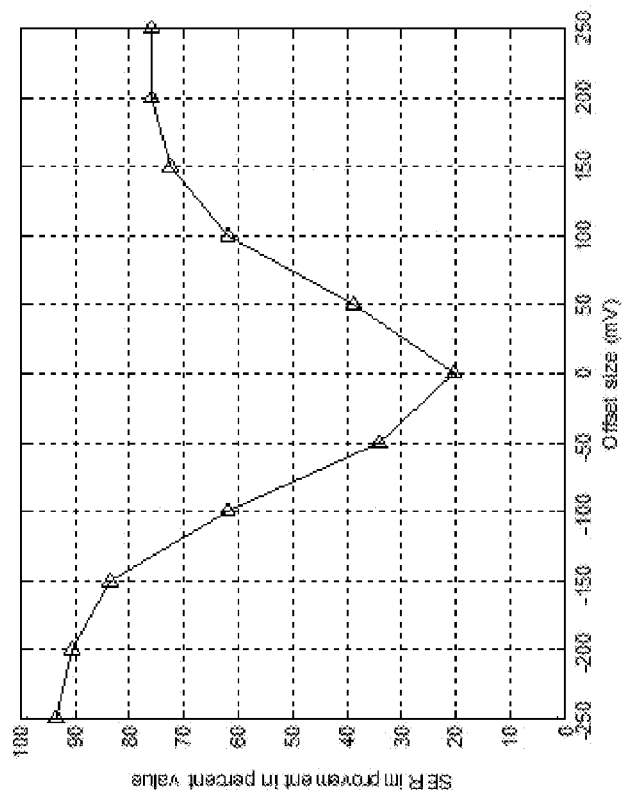
FIG. 9B illustrates SER improvements at different offset values when an ICI detector is used, according to certain aspects of the present disclosure.
Figure 9A:
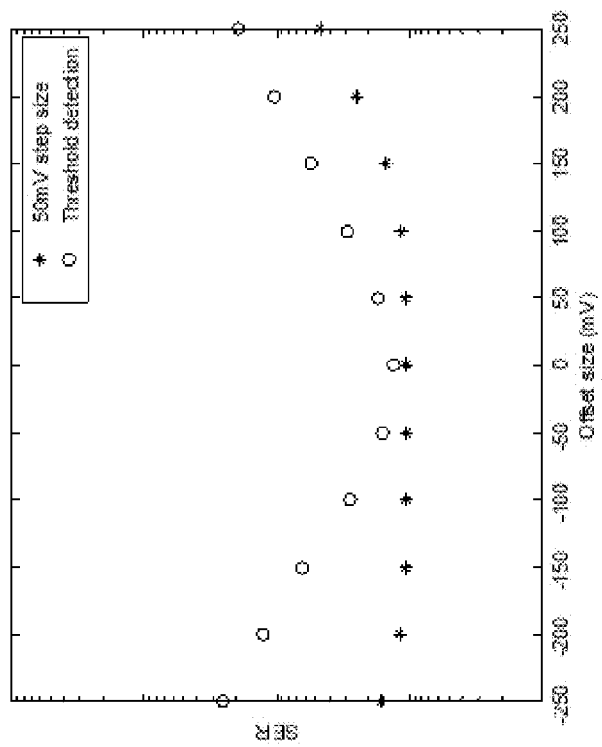
FIG. 9A illustrates a comparison of SERs versus offset values of an ICI detector and a threshold detector, according to certain aspects of the present disclosure.

FIG. 9A illustrates a comparison of SERs versus offset values of an ICI detector and a threshold detector, according to certain aspects of the present disclosure. Corresponding FIG. 9B illustrates the SER improvement at different offset values when the ICI detector was used Specifically, FIG. 9A illustrates the SERs versus offsets for the threshold detector and the word line ICI detector with 50 mV step size and 7 reads on 20K cycled blocks with 8 hours of retention at 75 C degrees. Simulation results show that the word line ICI detector improves the symbol error rate (SER) compared to the threshold detection method in the presence or absence of offset.

FIG. 9B shows the improvement of the word line ICI detector in SER versus offset values. In the absence of an offset, there is an approximate 20% improvement with the word line ICI detector in SER compared to the threshold detector. This performance improvement of the word line ICI detector in SER increases with increasing offset values.

Figure 10:
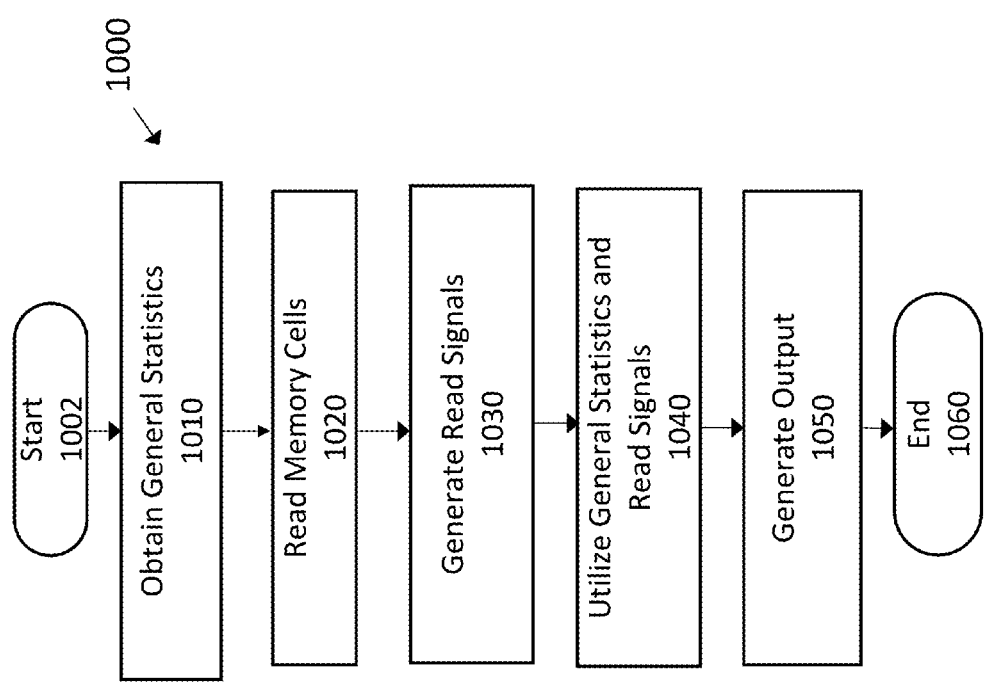
FIG. 10 is a flowchart illustrating a process for generating an output for decoding, according to certain aspects of the present disclosure.

FIG. 10 is a flowchart illustrating a process for generating a decoder input, in accordance with an embodiment of the present disclosure. The process 1000, however, is exemplary. The process 1000 can be altered, e.g., by having stages added, changed, removed, or rearranged. One or more stages may be implemented by the word line ICI detector as described in reference to FIG. 1 above. One or more of the stages may be implemented on data storage system 200. For example, the one or more of the stages may be implemented by as part of the controller 201. Alternatively, in some implementations, one or more of the stages may be implemented as a separate component to be operated in conjunction with the controller described above with respect to FIG. 2. The method 1000 may begin at stage 1002 and proceed to stage 1010.

At stage 1010, general statistics of the behavior of memory cells are obtained. In one embodiment, the general statistics can be imported from another device, an electronic medium, configuration memory 205, or storage medium 202. In the exemplary embodiment, general statistics can be in forms of tables, equations, or both that were pre-programmed in the configuration memory 205, storage medium 202, the electronic medium, or another device.

In one embodiment, general statistics including results from training data are generated from statistic generator 220. The statistic generator module 220 could be implemented as part of the controller 201 or separate from the controller as a standalone module. In this case, statistics can be retrieved from the statistic generator at the beginning of the process at stage 1010 or at stage 1040.

At stage 1020, memory cells of flash device 203 may be read. A whole or a partial word line may be selected and all the memory cells located on the whole or partial word line are read. The memory cells may be read multiple times to generate soft information relating to the reliability of the data.

At stage 1030, the read signals for a sequence of memory cells are generated. The read signals comprise the host data. In some implementations, the read signals also comprise metadata such as word line information and memory addresses of the memory cells so appropriate statistics from training data can be obtained for a particular word line.

At stage 1040, statistics relating to the read signals are utilized. In general, the statistics include ICI statistics based on adjacent data levels of a target cell. In particular, ICI statistics include information on the data levels of the left and right cells as well as the data level of the target cell. In certain implementations, statistics for each word line are also obtained. In other implementations, the statistics on the behavior of each individual memory cell within a word line are also included.

At stage 1050, an ICI detector output is generated based on the read signals and the ICI statistics. In some aspects, a sequence of detector output is generated based on the read signals of each of the cells (e.g., soft information of a target cell, x(i)) along a whole or partial word line using detection algorithms such as the BCJR algorithm.)

In a further embodiment, the statistics and the soft information obtained from the read operations can be used by trellis-based detection algorithms to detect the read data. BCJR algorithm scan be used to produce APPs or LLRs. While SOVA, sliding window algorithms, and other types of algorithms can be used to produce approximate APPs or LLRs.

In certain implementations, the trellis may include 16 states per time index i if only the left and right adjacent cells of a target cell is considered in the flash channel. In certain implementations, a word line detector generates path metrics and cumulative path metrics based on BCJR, Max-Log-MAP, SOVA, modified SOVA, or sliding window algorithms. In certain implementations, the BCJR algorithm processes segmented data instead of a stream of encoded data. Specifically, each segment of data has a determined length based on the number of cells along a word line.

At stage 1060, the method 1000 may end.

Figure 11:
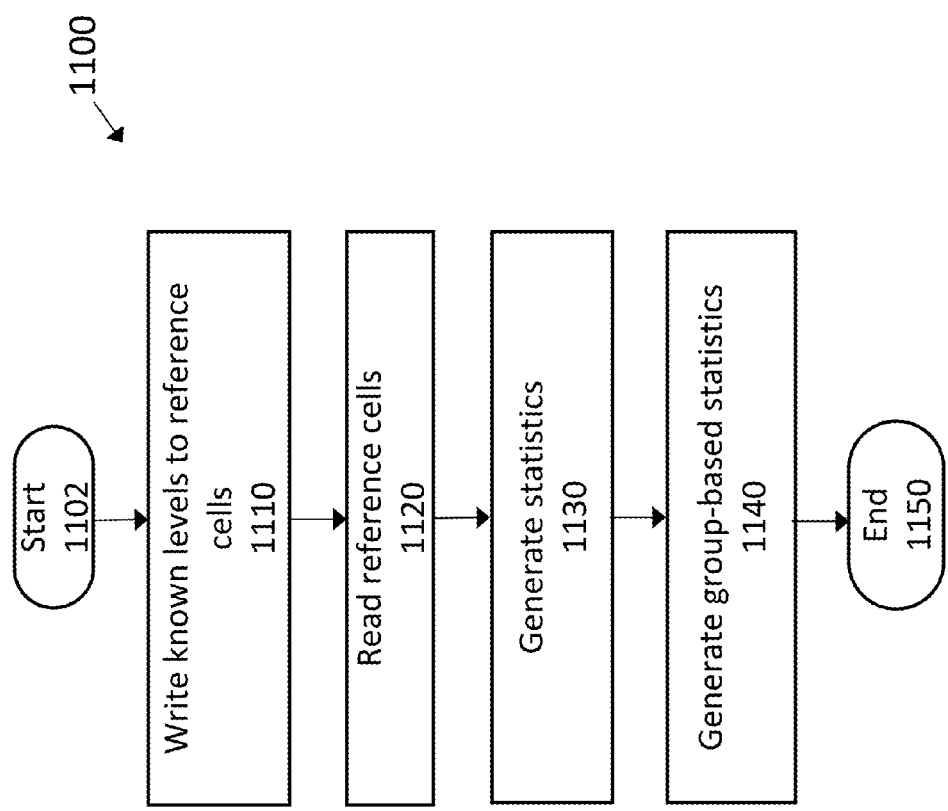
FIG. 11 is a flowchart illustrating a process for generating statistics, according to certain aspects of the present disclosure.

FIG. 11 is a flowchart illustrating a process for generating statistics, in accordance with an embodiment of the present disclosure. The process 1100, however, is exemplary. The process 1100 can be altered, e.g., by having stages added, changed, removed, or rearranged. One or more stages may be implemented in the word line ICI detector as described in reference to FIG. 1 above. One or more of the stages may be implemented on data storage system 200. For example, the one or more of the stages may be implemented by a static generator 220 as part of the controller 201. Alternatively, in some implementations, one or more of the stages may be implemented as a separate component to be operated in conjunction with the controller described above with respect to FIG. 2. The method 1100 may begin at stage 1102 and proceed to stage 1110.

At stage 1110, a number of reference cells are selected and the reference cells are programmed with known data levels. The cells can be programmed one word line at a time or the cells can be programmed as a block.

At stage 1120, the reference cells are read back and the read signals of the cells are recorded. The cells may be read with different number of reads. In one embodiment the cells were read using 256 read levels. In another embodiment, the cells were read using 512 read levels to generate smoother probability density curves. In other implementations, the cells were read using multiple read levels around the boundary region of any two closest voltage distributions.

At stage 1130, statistics and particularly the voltage distributions for L0-L3 are generated. In particular, as the cells are read at 256 or 512 levels or at 3, 5, or 7 reads per boundary region. Probability density functions or soft information for each level are then generated using the obtained read signals.

At stage 1140, group-based statistics are generated. In particular, the probability density functions of a group of target cells are calculated based on the data levels of adjacent cells. As previously indicated, in the exemplary embodiment of FIGS. 3 and 5, each target cell 310 can have one of four possible data levels (L0-L3). Each of the target cells 310 has a left adjacent cell 320 and the left adjacent cell 320 can also have one of four possible data levels. Thus, there are sixteen probability density functions. Four of which are in region 50 when a group of target cells is L0: distribution 5000 is the probability density function for a group of target cells at voltage level 0 when their respective left cells 320 are at L0; distribution 5001 is the probability density function for a group target cells at voltage level 0 when their respective left cells 320 are at L1; distribution 5002 is the probability density function for a group of target cells at voltage level 0 when their respective left cells 320 are at L2; and distribution 5003 is the probability density function for a group of target cells at voltage level 0 when their respective left cells 320 are at L3. Similarly, there are four other probability density functions at each of the regions 51, 52, and 52 when a group of target cells is at voltage levels 1, 2, and 3, respectively.

In an embodiment, a detection trellis is built based on the statistics, and particularly on the group-based probability density functions.

At stage 1050, the method 1100 may end.

Figure 12:
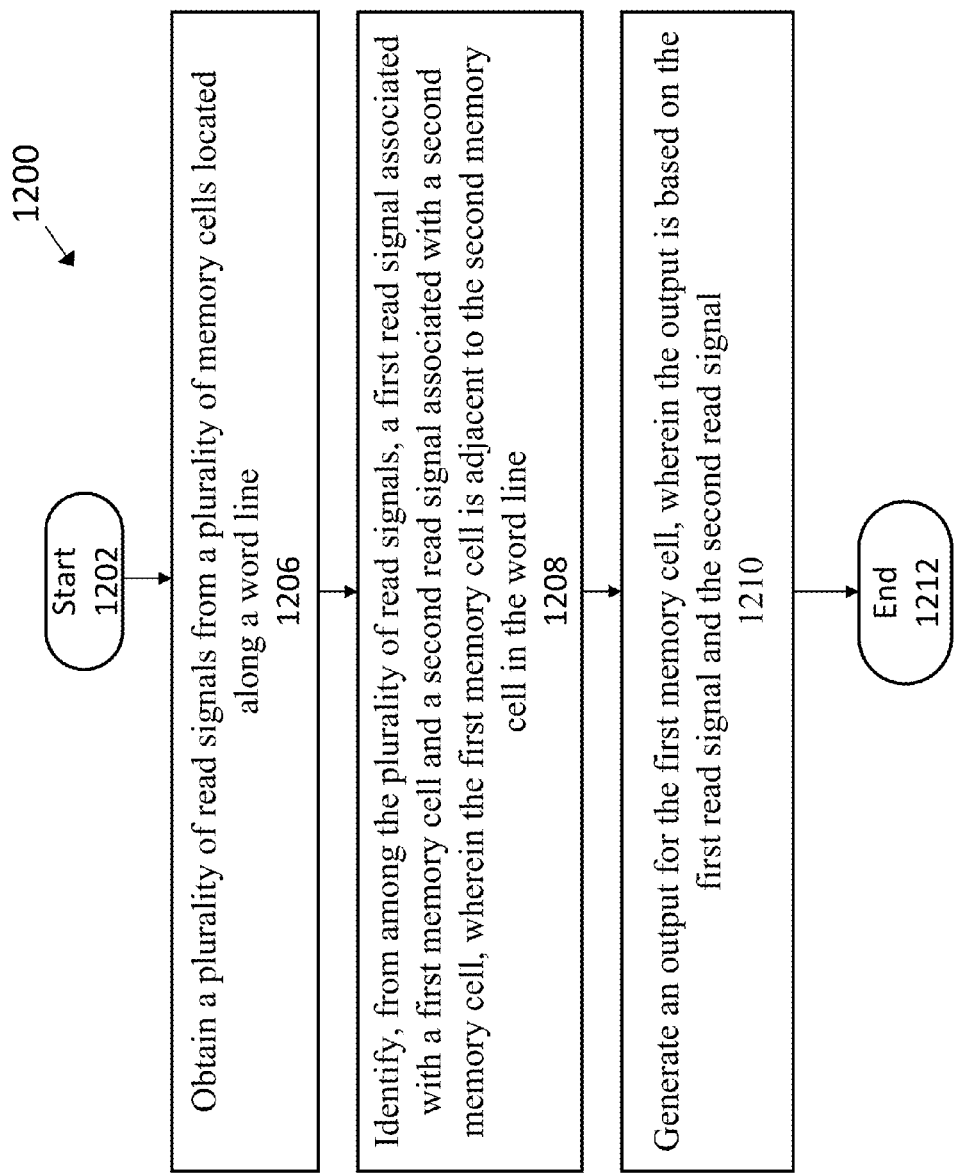
FIG. 12 is a flowchart illustrating a process for retrieving information stored in flash memory, according to certain aspects of the disclosure.

FIG. 12 is a flowchart illustrating a process 1200 for retrieving information stored in flash memory, according to certain aspects of the disclosure. Process 1200 begins with stage 1202 in which one or more processors (e.g., one or more processors of controller 201) execute instructions to perform the stages illustrated in process 1200. After stage 1202, process 1200 proceeds to step 1206 in which a plurality of read signals from memory cells in a word line are read. In certain aspects, the cells in the word line may be read together by controller 201. The read signals can provide an indication as to the data that is stored (e.g., encoded) in one or more cells in the word line. By way of example, the read signals may indicate a programming level corresponding to one or more cells in the word line.

In stage 1208, a first read signal and a second read signal are identified, from among the plurality of read signals. In certain aspects, the first read signal is associated with a first memory cell and the second read signal is associated with a second memory cell, wherein the first memory cell is adjacent to the second memory cell in the word line. Depending on implementation, the second memory cell may be situated to the left (or to the right) of the first memory cell in the word line.

Next, in stage 1210 an output is generated for the first memory cell, wherein the output is based on the first read signal associated with the first memory cell and the second read signal associated with the second memory cell. In certain aspects, the output can be provided to a decoder (e.g., a LDPC decoder) and used to perform decoding of the first read signal. In this manner, the second read signal can be used to facilitate decoding of information that is stored in the first memory cell.

At stage 1212, process 1200 may end. However, in certain implementations, process 1200 may further comprise stages for identifying, from among the plurality of read signals, a third read signal associated with a third memory cell adjacent to the first memory cell, and wherein the output is further based on the third read signal associated with the third memory cell.

Furthermore, depending on implementation, generating the output can further comprise stages for determining a programming level associated with the second memory cell based on the second read signal and selecting the output based on the programming level associated with the second memory cell.

In certain aspects, the subject technology may include the implementation of different stages or steps that those discussed above with respect to process 1200. For example, the subject technology may be realized as a method for mitigating the effects of ICI on a flash output that is used for decoding in an electronic device, and specifically in a flash memory device. The method may include reading a plurality of memory cells located along a word line, generating a plurality of read signals based on the reading of the plurality of memory cells, obtaining inter-cell interference statistics for at least two of the plurality of read signals associated with a first memory cell and a second memory cell, where the second memory cell is adjacent to the first memory cell, and generating an ICI detector output based on the at least two of the plurality of read signals and the inter-cell interference statistics.

In accordance with another aspect, the inter-cell interference statistics may include individual word line statistic for each specific word line within a flash memory device. The inter-cell interference detector includes a trellis having a plurality of transition states, and each of the plurality of the transition states includes an initial state and an end state, and each of the initial state and end state includes data levels of a first memory cell and a second memory cell. In certain implementations, the second memory cell is the cell that is on the immediate left of the first memory cell. In other implementations, the second memory cell is the cell that is on the immediate right of the first memory cell.

In yet another aspect, the systems and methods for mitigating the effect of ICI further include obtaining a read signal of a third memory cell and the obtaining the inter-cell interference statistics is based on the read signals of the first, second, and third memory cells. In certain aspects, the third memory cell is also adjacent to the first memory cell. In particular, the second memory cell is the cell that is on the immediate left of the first memory cell and the third memory cell is the cell that is on the immediate right of the first memory cell. In some implementations, the third memory cell is on the immediate left of the second memory cell.

In certain aspects, the inter-cell interference statistics comprise at least one mean value change, at least one variance value change, or both in a probability density function.

The systems and methods for mitigating the effect of ICI can further include generating the group-based statistics from which inter-cell interference statistics are derived from. The generation of the group-based inter-cell interference statistics may be obtained from training data. In particular, the steps of generating group-based statistics may include programming known data levels to a plurality of reference cells along a word line, reading the plurality of reference cells located along the word line, generating a plurality of read signals based on the reading of the plurality of reference cells, and generating group-based inter-cell interference statistics for each of the data levels based on the read signals associated with a group of target cells, wherein each of the target cells is adjacent to a cell with a certain data level. In some implementations, each of the target cells is adjacent to a cell that locates on the immediate left of the target cell.

The group-based inter-cell interference statistics may also include data of another group of cells, where each of these cells contains data at a certain level and each of the cells is also adjacent to the target cell. In some implementations, each of these cells is a cell that locates on the immediate right of a target cell.

In yet further aspects, the systems and methods for mitigating ICI effects can be realized as a data storage system. The data storage system can include a configuration memory, a plurality of memory cells, and a controller that is coupled to the configuration memory and the memory cells. In some implementations, the controller can be configured to read the plurality of memory cells located along a word line, generate a plurality of read signals based on the reading of the plurality of memory cells, obtain inter-cell interference statistics from the configuration memory for at least two of plurality of read signals associated with a first memory cell and a second memory cell that is adjacent to the first memory cell, and generate an output based on the plurality of read signals and the inter-cell interference statistics.

In certain aspects, the controller can be configured to generate group-based statistics by program known data levels to a plurality of reference cells along a word line, read the plurality of reference cells located along the word line, generate a plurality of read signals based on the reading of the plurality of reference cell, and generate the group-based statistics for each of the data levels based on the read signals associated with a group of the plurality of reference cells, wherein each of the cells of the group of the plurality of reference cells is adjacent to a cell with a certain data level. In some implementations the controller can be further configured to generate a trellis that includes a plurality of transition states, wherein each of the plurality of the transition states comprises an initial state and an end state and each of the initial state and end state comprises data levels of two adjacent cells.

In yet another implementation, the systems and methods for mitigating the effects of ICI may be realized as an article of manufacture for mitigating effects of inter-cell interference in an electronic storage, the article of manufacture includes at least one non-transitory processor readable storage medium, and instructions stored on the at least one medium. The instructions are configured to be readable from the at least one medium by at least one processor and thereby cause the processor to read a plurality of memory cells located in an electronic storage, generate a plurality of read signals based on the reading of the plurality of memory cells, obtain group-based inter-cell interference statistics for at least two of plurality of read signals associated with a first memory cell and a second memory cell that is adjacent to the first memory cell and generate an output based on the plurality of read signals and the inter-cell interference statistics. In one aspect, the instructions are further configured to generate group-based inter-cell interference statistics for each of the data levels based on read signals associated with a group of the plurality of reference cells, wherein each of the cells of the group of the plurality of reference cells is adjacent to a cell with a certain data levels.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes can be rearranged. For example, in some implementations some of the steps can be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the present disclosure or that such embodiment applies to all configurations of the present disclosure. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for retrieving information stored in flash memory, comprising:
    obtaining a plurality of read signals from a plurality of memory cells;
    identifying, from among the plurality of read signals, a first read signal associated with a first memory cell and a second read signal associated with a second memory cell, wherein the first memory cell is adjacent to the second memory cell in a word line; and
    generating an output for the first memory cell, wherein the output is based on the first and the second read signals.

2. The method of claim 1, further comprising:
    decoding the first read signal based on the output.

3. The method of claim 1, further comprising:
    identifying, from among the plurality of read signals, a third read signal associated with a third memory cell adjacent to the first memory cell, and
    wherein the output is further based on the third read signal associated with the third memory cell.

4. The method of claim 1, wherein generating the output further comprises:
    determining a programming level associated with the second memory cell based on the second read signal; and
    selecting the output based on the programming level associated with the second memory cell.

5. The method of claim 1, wherein generating the output further comprises:
    referencing a trellis having a plurality of transition states, wherein each of the transition states comprises an initial state and an end state, and
    wherein each of the initial state and the end state comprises data levels of two adjacent cells.

6. The method of claim 1, wherein the output comprises one or more of a log-likelihood ratio (LLR) and an a posteriori probability (APP).

7. The method of claim 1, wherein the output is based on one or more of retention characteristics and endurance characteristics associated with the flash memory.

8. The method of claim 1, wherein the first read signal and the second read signal comprise hard decision information.

9. The method of claim 1, wherein the first read signal and the second read signal comprise soft decision information.

10. The method of claim 1, wherein the output is based on inter-cell interference data corresponding with one or more programming levels.

11. A data storage system, comprising:
    a configuration memory;
    a plurality of memory cells; and
    a controller coupled to the configuration memory and the plurality of memory cells, wherein the controller is configured to perform operations for:
        obtaining a plurality of read signals based on the reading of the plurality of memory cells;
        identifying, from among the plurality of read signals, a first read signal associated with a first memory cell and a second read signal associated with a second memory cell, wherein the first memory cell is adjacent to the second memory cell in a word line; and generating an output for the first memory cell, wherein the output is based on the first and the second read signals.

12. The data storage system of claim 11, wherein the controller is further configured to perform steps for:

decoding the first read signal based on the output.

13. The data storage system of claim 11, wherein the controller is further configured to perform steps for:

identifying, from among the plurality of read signals, a third read signal associated with a third memory cell adjacent to the first memory cell, and wherein the output is further based on the third read signal associated with the third memory cell.

14. The data storage system of claim 11, wherein generating the output further comprises:

determining a programming level associated with the second memory cell based on the second read signal; and selecting the output based on the programming level associated with the second memory cell.

15. The data storage system of claim 11, wherein generating the output further comprises:

referencing a trellis having a plurality of transition states, wherein each of the transition states comprises an initial state and an end state, and wherein each of the initial state and the end state comprises data levels of two adjacent cells.

16. The data storage system of claim 11, wherein the output comprises one or more of a log-likelihood ratio (LLR) and an a posteriori probability (APP).

17. The data storage system of claim 11, wherein the output is based on one or more of retention characteristics and endurance characteristics.

18. The data storage system of claim 11, wherein the first read signal and the second read signal comprise hard decision information.

19. The data storage system of claim 11, wherein the first read signal and the second read signal comprise soft decision information.

20. The data storage system of claim 11, wherein the output is based on inter-cell interference data corresponding with one or more programming levels.

21. An article of manufacture for mitigating effects of inter-cell interference in an electronic storage, the article of manufacture comprising:

at least one non-transitory processor readable storage medium; and instructions stored on the at least one medium, wherein the instructions are configured to be readable from the at least one medium by at least one processor and thereby cause the at least one processor to perform operations for:

obtaining a plurality of read signals based on the reading of the plurality of memory cells;

identifying, from among the plurality of read signals, a first read signal associated with a first memory cell and a second read signal associated with a second memory cell, wherein the first memory cell is adjacent to the second memory cell in a word line; and generating an output for the first memory cell, wherein the output is based on the first and second read signals.

22. The article of manufacture of claim 21, wherein the processor is configured to perform operations for:

decoding the first read signal based on the output.

23. The article of manufacture of claim 21, wherein the processor is configured to perform operations for:

identifying, from among the plurality of read signals, a third read signal associated with a third memory cell adjacent to the first memory cell, and wherein the output is further based on the third read signal associated with the third memory cell.

\* \* \* \* \*